(12) United States Patent
Jiang et al.

(10) Patent No.: US 12,389,780 B2
(45) Date of Patent: Aug. 12, 2025

(54) DISPLAY DEVICE AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Congcong Jiang, Wuhan (CN); Peng Huang, Wuhan (CN)

(73) Assignee: WUHAN CHINA STAR OPTOELECTRONICS SEMICONDUCTOR DISPLAY TECHNOLOGY CO., LTD., WUHAN (CN)

( * ) Notice: Subject to any disclaimer, the term of this patent is extended or adjusted under 35 U.S.C. 154(b) by 0 days.

(21) Appl. No.: 17/798,966

(22) PCT Filed: Jun. 30, 2022

(86) PCT No.: PCT/CN2022/103060
§ 371 (c)(1),
(2) Date: Aug. 11, 2022

(87) PCT Pub. No.: WO2023/236293
PCT Pub. Date: Dec. 14, 2023

(65) Prior Publication Data
US 2024/0196701 A1    Jun. 13, 2024

(30) Foreign Application Priority Data

Jun. 8, 2022 (CN) .......................... 202210646155.7

(51) Int. Cl.
*H10K 59/82* (2023.01)
*H10K 59/80* (2023.01)
(Continued)

(52) U.S. Cl.
CPC ........... *H10K 59/873* (2023.02); *H10K 59/82* (2023.02); *H10K 77/111* (2023.02); *H10K 2102/311* (2023.02)

(58) Field of Classification Search
CPC ................. H10K 77/111; H10K 59/82; H10K 2102/311; H10K 59/873; G09F 9/301
See application file for complete search history.

(56) References Cited

U.S. PATENT DOCUMENTS

2019/0228698 A1* 7/2019 Hu ........................ H10K 77/111
2020/0209916 A1* 7/2020 Zhang .................. H10K 77/111

FOREIGN PATENT DOCUMENTS

CN    104181716 A    12/2014
CN    206640623 U    11/2017
(Continued)

OTHER PUBLICATIONS

PCT International Search Report for International Application No. PCT/CN2022/103060, mailed on Dec. 20, 2022, 8pp.
(Continued)

*Primary Examiner* — Thanh Y. Tran
(74) *Attorney, Agent, or Firm* — The Roy Gross Law Firm, LLC; Roy D. Gross

(57) ABSTRACT

A display device and a mobile terminal are provided in embodiments of the present application. A display portion of a display panel in the display device provided in the embodiments includes a plane display portion and a first arc surface display portion connected to the plane display portion and a bending portion. In a direction of a light-emitting side of a display module, a height of a horizontal surface where a top surface of an encapsulation structure is located is greater than or equal to a height of a horizontal surface where a top surface of a front frame is located, so as to eliminate occurrence of motion interference caused by a touch (Continued)

between fingers and an edge of the front frame when swiping a screen in prior art.

20 Claims, 2 Drawing Sheets

(51) Int. Cl.
*H10K 77/10* (2023.01)
*H10K 102/00* (2023.01)

(56) References Cited

FOREIGN PATENT DOCUMENTS

| CN | 207070119 U | 3/2018 |
|---|---|---|
| CN | 109461381 A | 3/2019 |
| CN | 209313878 U | 8/2019 |
| CN | 110493398 A | 11/2019 |
| CN | 111681543 A | 9/2020 |
| CN | 113437048 A | 9/2021 |
| CN | 113628543 A | 11/2021 |
| CN | 113674624 A | 11/2021 |
| CN | 113744632 A | 12/2021 |
| CN | 114093273 A | 2/2022 |
| CN | 114203050 A | 3/2022 |
| EP | 2423734 A1 | 2/2012 |

OTHER PUBLICATIONS

PCT Written Opinion of the International Search Authority for International Application No. PCT/CN2022/103060, mailed on Dec. 20, 2022, 7pp.

Chinese Office Action issued in corresponding Chinese Patent Application No. 202210646155.7 dated Apr. 23, 2023, pp. 1-9, 21pp.

* cited by examiner

DISPLAY DEVICE AND MOBILE TERMINAL

BACKGROUND OF DISCLOSURE

This application is a National Phase of PCT Patent Application No. PCT/CN2022/103060 having International filing date of Jun. 30, 2022, which claims the benefit of priority of Chinese Patent Application No. 202210646155.7, filed Jun. 8, 2022, the contents of which are all incorporated herein by reference in their entirety.

Technical Field

The present application relates to a technical field of displays, and specifically, to a display device and a mobile terminal.

Description of Prior Art

With development of electronic technology, electronic devices such as mobile phones and tablet computers have become an indispensable part of people's daily life and work. Users have higher and higher requirements for appearance design of display panels.

In existing display panels, in order to improve a screen-to-body ratio and reduce a size of a frame, a pad bending technology is usually used, which makes a protruding end of a flexible polyimide (PI) substrate of the display panel bend to a back of a display, so as to realize a narrow frame of a non-display area. However, in a process of matching the existing display panel with a front frame, due to existence of a bending portion, the front frame must be set with a reserved space, and the bending portion is accommodated in the reserved space. Therefore, a height of a horizontal plane where a top surface of the front frame is located is usually set to be greater (about 2 mm) than a height of a horizontal plane where a top surface of a display portion is located. When users swipe the display device, fingers will touch an edge of the front frame, resulting in adverse effects such as occurrence of motion interference.

BRIEF SUMMARY OF DISCLOSURE

Technical Problem

A display device provided in embodiments of the present application is used for alleviating deficiencies in related technologies.

Technical Schemes

In order to realize above-mentioned functions, a technical scheme provided in the embodiments of the present application is as follows.

A display device is provided in the embodiment of the present application, which comprises a front frame and a display module located in the front frame, and the display module comprises:

a display panel comprising a display portion and a binding portion arranged opposite to each other, and a bending portion connected between the display portion and the binding portion; and the display portion comprising a plane display portion and a first arc surface display portion connected between the plane display portion and the bending portion;

an encapsulation structure arranged on a light-emitting side of the display panel; and a supporting layer located on one side of the display portion close to the binding portion, and the supporting layer comprising a first supporting sub portion arranged corresponding to the plane display portion and a second supporting sub portion arranged corresponding to the first arc surface display portion; and a shape of the second supporting sub portion being matched with a shape of the first arc surface display portion;

wherein in a direction of a light-emitting side of the display module, a height of a horizontal plane where a top surface of the encapsulation structure is located is greater than or equal to a height of a horizontal plane where a top surface of the front frame is located.

In the display device provided in an embodiment of the present application, the front frame comprises a bottom frame located on one side of the supporting layer away from the display panel and a first frame located on one side of the bottom frame close to the first arc surface display portion, and the first frame is perpendicular to the bottom frame; and in a direction perpendicular to the display panel, a height of a horizontal plane where a top surface of the first frame is located is less than or equal to the height of the horizontal plane where the top surface of the encapsulation structure is located.

In the display device provided in an embodiment of the present application, the display portion comprises a second arc surface display portion extending along a direction of the plane display portion away from the first arc surface display portion;

the supporting layer comprises a third supporting sub portion extending along a direction of the first supporting sub portion away from the second supporting sub portion; the third supporting sub portion is arranged opposite to the second arc surface display portion, and a shape of the third supporting sub portion is matched with a shape of the second arc surface display portion;

the front frame further comprises a second frame located on one side of the bottom frame close to the second arc surface display portion, and the second frame is perpendicular to the bottom frame; and wherein in the direction perpendicular to the display panel, a height of a horizontal surface where a top surface of the second frame is located is less than or equal to the height of the horizontal plane where the top surface of the encapsulation structure is located.

In the display device provided in an embodiment of the present application, a radius of curvature of the first arc surface display portion is same as a radius of curvature of the second arc surface display portion.

In the display device provided in an embodiment of the present application, the display device further comprises a binding component connected to the binding portion, and in a direction from the second frame pointing to the first frame, a distance between the binding portion and the bottom frame gradually decreases.

In the display device provided in an embodiment of the present application, the display device comprises a supporting member, and the supporting member is located between the binding portion and the first supporting sub portion; and wherein in the direction from the second frame pointing to the first frame, a thickness of the supporting member gradually increases.

In the display device provided in an embodiment of the present application, the display module comprises at least two non-bending areas and a bendable area arranged between adjacent two of the non-bending areas; at least a part of the plane display portion is located in the bendable area, and both the first arc surface display portion and the second arc surface display portion are located in the non-bending areas; and wherein the first supporting sub portion comprises a grid structure located in the bendable area.

In the display device provided in an embodiment of the present application, a material of the supporting layer is metal.

In the display device provided in an embodiment of the present application, the display portion comprises a rolling portion and a non-rolling portion connected between the rolling portion and the bending portion;

the display device comprises a rolling shaft located on the one side of the supporting layer away from the display panel and arranged close to the rolling portion;

and the rolling portion is wound on the rolling shaft, and the rolling shaft is used to roll up or unroll the display module; and wherein the non-rolling portion comprises the first arc surface display portion, and the rolling portion comprises a second arc surface display portion along a direction of the plane display portion away from the first arc surface display portion; when the display panel is in a unrolled state, in the direction perpendicular to the display panel, the second arc surface display portion and the first arc surface display portion are symmetrically arranged with respect to a horizontal centerline of the plane display portion.

In the display device provided in an embodiment of the present application, the first supporting sub portion comprises a supporting rolling portion arranged corresponding to the rolling portion, and a shape of the supporting rolling portion is matched with a shape of the rolling portion; wherein the supporting rolling portion is wound on the rolling shaft, and the supporting rolling portion comprises a plurality of hollowing portions; and wherein the front frame further comprises a second frame located on one side of the bottom frame close to the rolling portion, and the second frame is perpendicular to the bottom frame; and in the direction perpendicular to the display panel, a height of a horizontal plane where a top surface of the second frame is located is less than or equal to the height of the horizontal plane where the top surface of the encapsulation structure is located.

In the display device provided in an embodiment of the present application, the display device further comprises a binding component connected to the binding portion and a supporting member located between the binding portion and the first supporting sub portion; and wherein in a direction from the second frame pointing to the first frame, a thickness of the supporting member gradually increases.

In the display device provided in an embodiment of the present application, the encapsulation structure comprises a flexible substrate and a flexible cover plate arranged in layers, and the flexible substrate is located between the display panel and the flexible cover plate; and wherein a material of the flexible substrate is one of glass cover plate and ultra-thin glass; and the flexible cover plate is a combination of a cover plate material protective window and an optically clear adhesive, and a material of the cover plate material protective window is one of polyethylene glycol terephthalate and colorless polyimide.

In the display device provided in an embodiment of the present application, the mobile terminal comprises a terminal body and a display device, the terminal body and the display device are integrated, and the display device comprises a front frame and a display module located in the front frame, and the display module comprising:

a display panel, the display panel comprising a display portion and a binding portion arranged opposite to each other, and a bending portion connected between the display portion and the binding portion; and the display portion comprising a plane display portion and a first arc surface display portion connected between the plane display portion and the bending portion;

an encapsulation structure arranged on a light-emitting side of the display panel; and a supporting layer located on one side of the display portion close to the binding portion, and the supporting layer comprising a first supporting sub portion arranged corresponding to the plane display portion and a second supporting sub portion arranged corresponding to the first arc surface display portion; and a shape of the second supporting sub portion being matched with a shape of the first arc surface display portion;

wherein in a direction of the light-emitting side of the display module, a height of a horizontal plane where a top surface of the encapsulation structure is located is greater than or equal to a height of a horizontal plane where a top surface of the front frame is located.

In the display device provided in an embodiment of the present application, the front frame comprises a bottom frame located on one side of the supporting layer away from the display panel and a first frame located on one side of the bottom frame close to the first arc surface display portion, and the first frame is perpendicular to the bottom frame; and in a direction perpendicular to the display panel, a height of a horizontal plane where a top surface of the first frame is located is less than or equal to the height of the horizontal plane where the top surface of the encapsulation structure is located.

In the display device provided in an embodiment of the present application, the display portion comprises a second arc surface display portion extending along a direction of the plane display portion away from the first arc surface display portion;

the supporting layer comprises a third supporting sub portion extending along a direction of the first supporting sub portion away from the second supporting sub portion;

the third supporting sub portion is arranged opposite to the second arc surface display portion, and a shape of the third supporting sub portion is matched with a shape of the second arc surface display portion;

the front frame further comprises a second frame located on one side of the bottom frame close to the second arc surface display portion, and the second frame is perpendicular to the bottom frame; and wherein in the direction perpendicular to the display panel, a height of a horizontal surface where a top surface of the second frame is located is less than or equal to the height of the horizontal plane where the top surface of the encapsulation structure is located.

In the display device provided in an embodiment of the present application, a radius of curvature of the first arc surface display portion is same as a radius of curvature of the second arc surface display portion.

In the display device provided in an embodiment of the present application, the display device further comprises a binding component connected to the binding portion, and in a direction from the second frame pointing to the first frame, a distance between the binding portion and the bottom frame gradually decreases.

In the display device provided in an embodiment of the present application, the display device comprises a supporting member, and the supporting member is located between the binding portion and the first supporting sub portion; and wherein in the direction from the second frame pointing to the first frame, a thickness of the supporting member gradually increases.

In the display device provided in an embodiment of the present application, the display module comprises at least two non-bending areas and a bendable area arranged between adjacent two of the non-bending areas; at least a part of the plane display portion is located in the bendable area, and both the first arc surface display portion and the second arc surface display portion are located in the non-bending areas; and wherein the first supporting sub portion comprises a grid structure located in the bendable area.

In the display device provided in an embodiment of the present application, a material of the supporting layer is metal.

Advantageous Effect

The display device and the mobile terminal are provided in the embodiments of the present application. The display device comprises the front frame and the display module located in the front frame. The display module comprises the supporting layer, the display panel, and the encapsulation structure arranged in layers. The display portion is set to comprise the plane display portion and the first arc surface display portion connected between the plane display portion and the bending portion, which can reduce the height of the front frame of the display device. In a direction of the light-emitting side of the display module, the height of the horizontal plane where the top surface of the encapsulation structure is located is greater than or equal to the height of the horizontal plane where the top surface of the front frame is located, so as to eliminate occurrence of adverse phenomena such as motion interference caused by a touch between fingers and an edge of the front frame when swiping a screen in the prior art. In addition, the supporting layer is set to comprise the first supporting sub portion arranged corresponding to the plane display portion and the second supporting sub portion arranged corresponding to the first arc surface display portion, and the shape of the second supporting sub portion is matched with the shape of the first arc surface display portion, so as to support the display panel.

BRIEF DESCRIPTION OF DRAWINGS

The technical scheme and other advantageous effects of the present application will be apparent through the detailed description of a specific implementation mode of the present application in combination with the accompanying drawings.

DETAILED DESCRIPTION OF PREFERRED EMBODIMENTS

A display panel and a display device are provided in the embodiment of the present application. In order to make a purpose, a technical scheme, and an effect of the present application clearer and more accurate, the following is a further detailed description of the present application with reference to the attached drawings and examples. It should be understood that the specific embodiments described here are only used to explain the present application and are not used to limit the present application.

Figure 2:
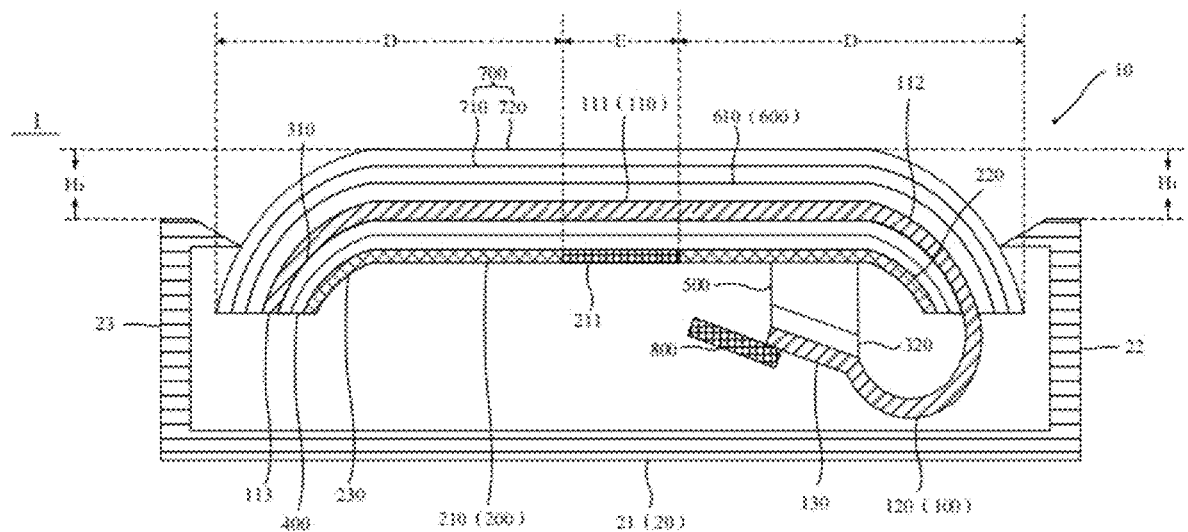
FIG. 2 is a first schematic structural diagram of a display device provided in an embodiment of the present application.
Figure 3:
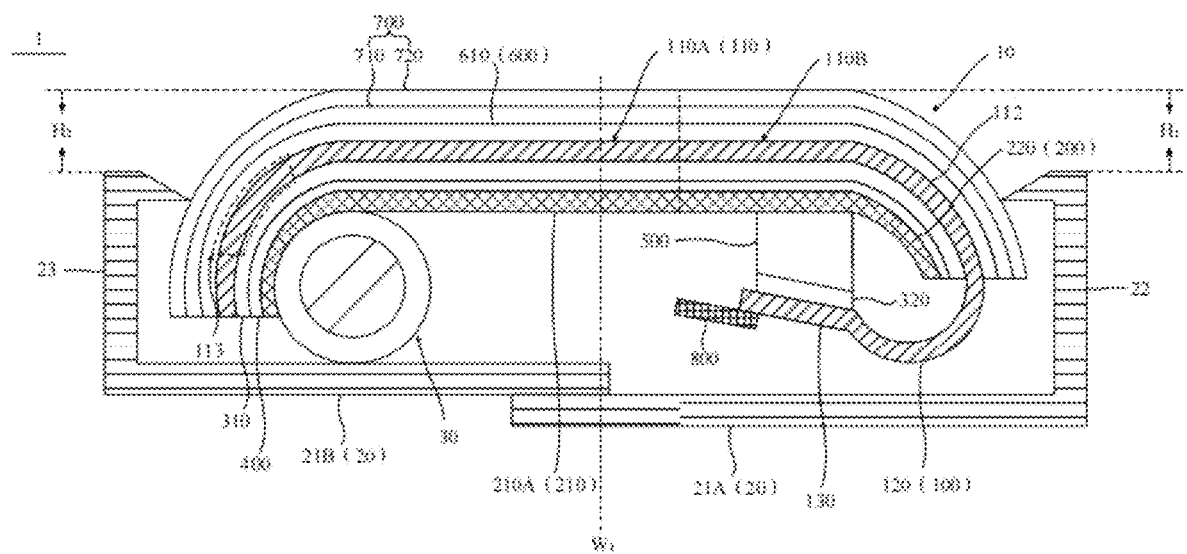
FIG. 3 is a second schematic structural diagram of the display device provided in an embodiment of the present application.

Please refer to FIG. 2 and FIG. 3, the display device 1 is provided in the embodiment of the present application and includes a front frame 20 and a display module 10 located in the front frame 20. The display module 10 includes:

a display panel 100, the display panel 100 includes a display portion 110 and a binding portion 130 arranged opposite to each other, and a bending portion 120 connected between the display portion 110 and the binding portion 130. The display portion 110 includes a plane display portion 111 and a first arc surface display portion 112 connected between the plane display portion 111 and the bending portion 120.

An encapsulation structure 700 is arranged on a light-emitting side of the display panel 100.

A supporting layer 200 is located on one side of the display portion 110 close to the binding portion 130. The supporting layer 200 includes a first supporting sub portion 210 arranged corresponding to the plane display portion 111, and a second supporting sub portion 220 arranged corresponding to the first arc surface display portion 112. A shape of the second supporting sub portion 220 is matched with a shape of the first arc surface display portion 112.

Wherein in a direction of the light-emitting side of the display module 10, a height of a horizontal plane where a top surface of the encapsulation structure 700 is located is greater than or equal to a height of a horizontal plane where a top surface of the front frame 20 is located.

Figure 1:
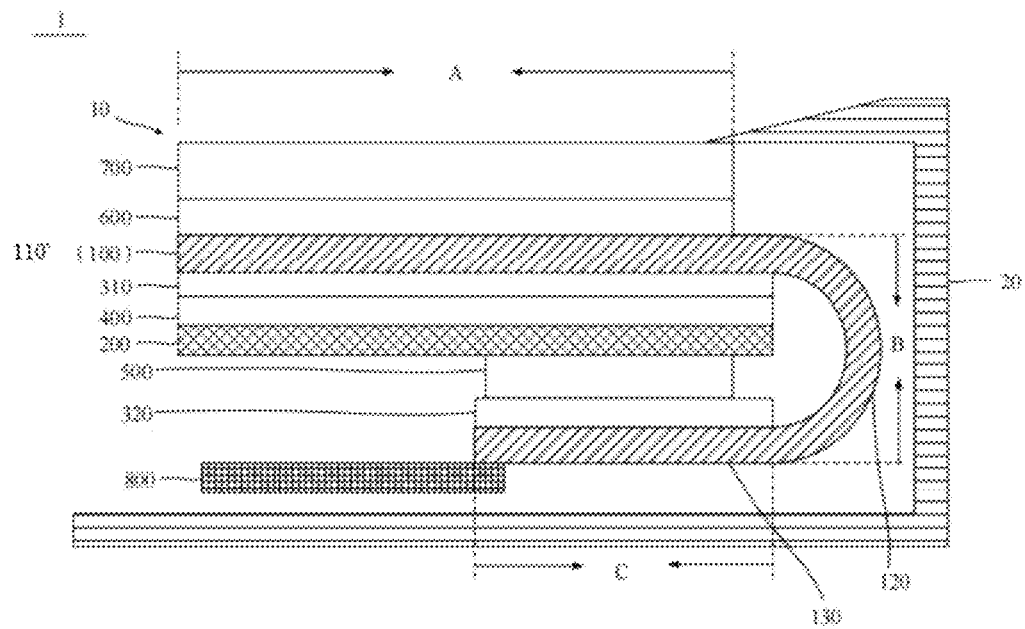
FIG. 1 is a schematic structural diagram of a display device in prior art.

It should be noted that at present, with development of electronic technology, electronic devices such as mobile phones and tablet computers have become an indispensable part of people's daily life and work. Users have higher and higher requirements for an appearance design of the display panel 100. In organic light emitting diode (OLED) technology, a pad bending technology is usually used to improve a screen-to-body ratio and reduce a size of a frame. As shown in FIG. 1, it is a schematic structural diagram of a display device in the prior art. Wherein the display device 1 includes a front frame 20 and a display module 10 located in the front frame 20. The display module 10 includes a supporting layer 200, a heat dissipation layer 400, a display panel 100, a functional film layer 600, and an encapsulation structure 700 arranged in layers. Wherein the display panel 100 includes a display area A, a binding area C away from one side of the display area A, and a bending area B located between the display area A and the binding area C. The display panel 100 includes a flat display portion 110' located in the display area A, a bending portion 120 located in the bending area B, and a binding portion 130 located in the binding area C and arranged opposite to the flat display portion 110'.

The display device 1 further includes a first backplane 310 located between the flat display portion 110' and the supporting layer 200, and a second backplane 320 and a supporting member 500 both located between the binding portion 130 and the supporting layer 200. Wherein due to existence of the bending portion 120, the front frame 20 must be provided with a reserved space (not shown in figure), and the bending portion 120 is accommodated in the reserved space. In a direction of a light-emitting side of the display module 10, a height of a horizontal plane where a top surface of the front frame 20 is located is greater (about 2 mm) than a height of a horizontal plane where a top surface of the display portion 110 is located, so as to prevent fine particles in external environment from entering the display module 10 during use of the display device 1, which will affect service life of the display module 10. However, it is inevitable that when the user swipes the display device 1, fingers will touch an edge of the front frame 20, resulting in adverse effects such as motion interference.

It can be understood that the embodiment of the present application reduces the height of the front frame 20 in the existing display device 1 by setting the display portion 110 to include the plane display portion 111 and the first arc surface display portion 112 connected between the plane display portion 111 and the bending portion 120. In the direction of the light-emitting side of the display module 10, the height of the horizontal plane where the top surface of the encapsulation structure 700 is located is greater than or equal to the height of the horizontal plane where the top surface of the front frame 20 is located, so as to eliminate the occurrence of adverse phenomena such as the motion interference caused by fingers touching the edge of the front frame 20 when swiping the screen in the prior art. In addition, the supporting layer 200 includes the first supporting sub portion 210 corresponding to the plane display portion 111 and the second supporting sub portion 220 corresponding to the first arc surface display portion 112. The shape of the second supporting sub portion 220 is matched with the shape of the first arc surface display portion 112, so as to support the display panel 100.

The technical scheme of the present application is described in combination with specific embodiments.

In an embodiment, please refer to FIG. 2, which is a first schematic structural diagram of the display device provided in the embodiment.

The display device 1 is provided in the embodiment, and the display device 1 includes the front frame 20 and the display module 10 located in the front frame 20. The display module 10 includes the display panel 100, a functional film layer 600 arranged on the light-emitting side of the display panel 100, the encapsulation structure 700 located on one side of the functional film layer 600 away from the display panel 100, and the supporting layer 200 arranged on a backlight side of the display panel 100. It should be noted that an organic light emitting diode (OLED) display panel 100 is taken as an example to describe the technical scheme of the present application in the embodiment.

In the embodiment, the display panel 100 includes the display portion 110 and the binding portion 130 arranged opposite to each other, and the bending portion 120 connected between the display portion 110 and the binding portion 130. Wherein the display portion 110 includes the plane display portion 111 and the first arc surface display portion 112 connected between the plane display portion 111 and the bending portion 120. One end of the bending portion 120 is connected to the first arc surface display portion 112, and another end of the bending portion 120 is connected to the binding portion 130. Wherein in the direction of the light-emitting side of the display module 10, the height of the horizontal plane where the top surface of the encapsulation structure 700 is located is greater than or equal to the height of the horizontal plane where the top surface of the front frame 20 is located.

Specifically, in the embodiment, the front frame 20 includes a bottom frame 21 located on one side of the supporting layer 200 away from the display panel 100 and a first frame 22 located on one side of the bottom frame 21 close to the first arc surface display portion 112. And the first frame 22 is perpendicular to the bottom frame 21. In a direction perpendicular to the display panel 100, a height of a horizontal plane where a top surface of the first frame 22 is located is less than or equal to the height of the horizontal plane where the top surface of the encapsulation structure 700 is located. Preferably, in this embodiment, a distance between the height of the horizontal plane where the top surface of the first frame 22 is located and the height of the horizontal plane where the top surface of the encapsulation structure 700 is located is $H_1$.

Please combine FIG. 1 with FIG. 2, it can be understood that compared with the prior art, one end of the bending portion 120 is connected to the flat display portion 110', and another end of the bending portion 120 is connected to the binding portion 130. Therefore, a reserved space must be provided in the front frame 20, and the bending portion 120 is accommodated in the reserved space. In the direction of the light-emitting side of the display module 10, the height of the horizontal plane where the top surface of the front frame 20 is located is usually greater (about 2 mm) than the height of the horizontal plane where the top surface of the display portion 110 is located. In the embodiment, the display portion 110 includes the plane display portion 111 and the first arc surface display portion 112 connected between the plane display portion 111 and the bending portion 120. The one end of the bending portion 120 is connected to the first arc surface display portion 112, and the another end of the bending portion 120 is connected to the binding portion 130, so as to reduce the height of the front frame 20 of the existing display device 1. In the direction of the light-emitting side of the display module 10, the height of the horizontal plane where the top surface of the first frame 22 is located is less than or equal to the height of the horizontal plane where the top surface of the encapsulation structure 700 is located, so as to eliminate the occurrence of adverse phenomena such as the motion interference caused by the touch between fingers and the edge of the front frame 20 when swiping the screen in the prior art.

Furthermore, in the embodiment, the supporting layer 200 is located on one side of the display portion 110 close to the binding portion 130. The supporting layer 200 includes the first supporting sub portion 210 arranged corresponding to the plane display portion 111 and the second supporting sub portion 220 arranged corresponding to the first arc surface display portion 112, and the shape of the second supporting sub portion 220 is matched with the shape of the first arc surface display portion 112. Specifically, the first supporting sub portion 210 and the plane display portion 111 are attached with each other, and the two are plane structures with matching shapes. The first supporting sub portion 210 is used to support the plane display portion 111. The second supporting sub portion 220 and the first arc surface display portion 112 are attached with each other, and they are arcs with matching shapes. The first supporting sub portion 210 is used to support the plane display portion 111, so as to maintain a shape of the display panel 100.

In the embodiment, the display panel 100 further includes a second arc surface display portion 113 extending along a direction of the plane display portion 111 away from the first arc surface display portion 112. The supporting layer 200 includes a third supporting sub portion 230 extending along a direction of the first supporting sub portion 210 away from the second supporting sub portion 220. The third supporting sub portion 230 is arranged corresponding to the second arc surface display portion 113, and a shape of the third supporting sub portion 230 is matched with a shape of the second arc surface display portion 113. The front frame 20 further includes a second frame 23 located on one side of the bottom frame 21 close to the second arc surface display portion 113, and the second frame 23 is perpendicular to the bottom frame 21. Wherein in the direction perpendicular to the display panel 100, a height of a horizontal plane where a top surface of the second frame 23 is located is less than or equal to the height of the horizontal plane where the top surface of the encapsulation structure 700 is located. Preferably, in this embodiment, a distance between the height of the horizontal plane where the top surface of the second frame 23 is located and the height of the horizontal plane where the top surface of the encapsulation structure 700 is located is $H_2$.

It can be understood that in this embodiment, the display portion 110 is set to include the plane display portion 111, the first arc surface display portion 112 connected between the plane display portion 111 and the bending portion 120, and the second arc surface display portion 113 extending along the direction of the plane display portion 111 away from the first arc surface display portion 112, making the display panel 100 a hyperboloid structure. Preferably, a radius of curvature of the first arc surface display portion 112 is same as a radius of curvature of the second arc surface display portion 113, which improves the screen-to-body ratio and aesthetics of the display panel 100. In addition, the one end of the bending portion 120 is connected to the first arc surface display portion 112, and the another end of the bending portion 120 is connected to the binding portion 130. In the direction perpendicular to the display panel 100, the height of the horizontal plane where the top surface of the first frame 22 is located is less than or equal to the height of the horizontal plane where the top surface of the encapsulation structure 700 is located, and the height of the horizontal plane where the top surface of the second frame 23 is located is less than or equal to the height of the horizontal plane where the top surface of the encapsulation structure 700 is located, so as to eliminate the occurrence of adverse phenomena such as the motion interference caused by the touch between fingers and the edge of the front frame 20 when swiping the screen in the prior art.

Wherein in this embodiment, the supporting layer 200 includes the first supporting sub portion 210 arranged corresponding to the plane display portion 111, the second supporting sub portion 220 arranged corresponding to the first arc surface display portion 112, and the third supporting sub portion 230 arranged corresponding to the second arc surface display portion 113, so as to maintain the shape of the display panel 100.

In this embodiment, the functional film layer 600 can be attached to a side of the display panel 100 away from the supporting layer 200 through an adhesive layer (not shown in the figure). The functional film layer 600 includes, but is not limited to, a polarizer 610 located on the light-emitting side of the display panel 100. An orthographic projection of the functional film layer 600 in the direction perpendicular to the display module 10 covers the plane display portion 111, the first arc surface display portion 112, and the second arc surface display portion 113. The encapsulation structure 700 can be attached to the side of the functional film layer away from the display panel 100 through an adhesive layer (not shown in the figure). The shape of the encapsulation structure 700 is matched with a shape of the functional film layer 600, and can be attached to the side of the functional film layer 600 away from the display panel 100 through the adhesive layer. The encapsulation structure 700 includes, but is not limited to, a flexible substrate 710 and a flexible cover plate 720 that are successively away from the display panel 100. The flexible substrate 710 is located between the functional film layer 600 and the flexible cover plate 720. A material of the flexible substrate 710 includes, but is not limited to, one of cover window (CW) and ultra-thin glass (UTG). The flexible cover plate 720 includes, but is not limited to, a combination of cover plate material protective window (PW) and optically clear adhesive (OCA). Furthermore, a material of the cover plate material protective window includes, but is not limited to, one of polyethylene glycol terephthalate (PET) and colorless polyimide (CPI).

It can be understood that the functional film layer 600 includes the polarizer 610, and the encapsulation structure 700 includes the flexible substrate 710 and the flexible cover plate 720, which are only used for illustration. There are no specific restrictions on a film structure of the functional film layer 600 and a film structure of the encapsulation structure 700 in this embodiment. For example, in an embodiment, the encapsulation structure further includes a circulating protective film (CPF) located on one side of the flexible cover plate 720 away from the flexible substrate 710, and the circulating protective film is attached on one side of the flexible cover plate 720 away from the display panel 100. When the circulating protective film is scratched during use, customers can go to a maintenance point for replacement to prevent long-term poor appearance caused by scratches. In an embodiment, a depolarizing sheet-610 (POL less) technology can also be applied to prepare the display module 10.

It should be noted that in this embodiment, a height of a horizontal plane where a top surface of the flexible cover plate 720 is located is greater than or equal to the height of the horizontal plane where the top surface of the front frame 20 is located.

In this embodiment, the display device 1 further includes a binding component 800 connected to the binding portion 130. In a direction from the second frame 23 pointing to the first frame 22, a distance between the binding portion 130 and the bottom frame 21 gradually decreases. Wherein the binding component 800 includes, but is not limited to, a flexible printed circuit (FPC) and an integrated circuit (not shown in figure).

Specifically, the display device 1 further includes a supporting member 500, and the supporting member 500 is located between the binding portion 130 and the first supporting sub portion 210. Wherein in the direction from the second frame 23 pointing to the first frame 22, a thickness of the supporting member 500 gradually increases, so as to increase a distance between the binding component 800 and the bottom frame 21, and prevent the binding component 800 from directly contacting the bottom frame 21, which reduces wear of the binding component 800 and improves service life of the display module 10.

Furthermore, in this embodiment, an orthographic projection of the supporting member 500 on the binding portion 130 is located within a boundary of the binding portion 130, and an orthographic projection of the supporting member 500 on the first supporting sub portion 210 is located within a boundary of the first supporting sub portion 210. Because the binding portion 130 and the first supporting sub portion 210 are planar structures, the supporting member 500 can be better born between the binding portion 130 and the first supporting sub portion 210. When a film layer is bent and attached, the film layers of the display panel 100 will not be deformed and imprinted due to extrusion between the supporting member 500 and a film layer with low hardness or stiffness.

In this embodiment, the display device 1 further includes a heat dissipation layer 400 and the first backplane 310 both located between the display panel 100 and the supporting layer 200, and the second backplane 320 located between the binding portion 130 and the supporting member 500. Wherein the heat dissipation layer 400 is attached to one side of the supporting layer 200 close to the display panel 100, and a shape of the heat dissipation layer 400 is matched with a shape of the supporting layer 200. The heat dissipation layer 400 includes, but is not limited to, a metal copper layer, a pressure-sensitive adhesive layer, a white latex layer, a foam rubber layer, and a heat dissipation film layer that are successively away from the supporting layer 200. The first backplane 310 is attached to one side of the display panel 100 close to the supporting layer 200, and a shape of the first backplane 310 is matched with a shape of the display panel 100. The second backplane 320 is attached between the binding portion 130 and the supporting member 500; and the orthographic projection of the supporting member 500 covers an orthographic projection of the second backplane 320 in the direction perpendicular to the display panel 100.

Furthermore, in this embodiment, the display module 10 includes at least two non-bending areas D and a bendable area E arranged between adjacent two non-bending areas D. At least a part of the plane display portion 111 is located in the bendable area E, and both the first arc surface display portion 112 and the second arc surface display portion 113 are located in the non-bending areas D. Wherein the first supporting sub portion 210 includes a grid structure 211 located in the bendable area E, so as to improve bending performance of the display module 10 and prevent the film layer from debonding, fracture, and other phenomena during a bending process of the display module 10.

In an embodiment, please refer to FIG. 3, which is a second schematic structural diagram of the display device provided in the embodiment of the present application.

In this embodiment, a structure of the display module is similar/same as the first structure of the display module provided in the above-mentioned embodiment. Please refer to the description of the display module in the above-mentioned embodiment for details. It will not be repeated here. A difference between the two is only in that:

in this embodiment, the display module 10 is a flexible display module. The display portion 110 includes a rolling portion 110A, and a non-rolling portion 110B connected between the rolling portion 110A and the bending portion 120. The display device 1 includes a rolling shaft 30 located on one side of the supporting layer 200 away from the display panel 100 and arranged close to the rolling portion 110A. The rolling portion 110A is wound on the rolling shaft 30, and the rolling shaft 30 is used to roll up or unroll the display module 10. Wherein the non-rolling portion 110B includes the first arc surface display portion 112, and the rolling portion 110A includes the second arc surface display portion 113 extending along a direction of the plane display portion 111 away from the first arc surface display portion 112. When the display panel 100 is in a unrolled state, the second arc surface display portion 113 and the first arc surface display portion 112 are symmetrically arranged with respect to a horizontal centerline $W_1$ of the plane display portion 111 in the direction perpendicular to the display panel 100. It should be noted that this embodiment does not make specific restrictions on a method of winding the rolling portion 110A on the rolling shaft 30 and a method of the rolling shaft 30 driving the rolling portion 110A to rotate.

It can be understood that, in this embodiment, the display device 1 includes the rolling shaft 30 located on the side of the supporting layer 200 away from the display panel 100 and arranged close to the rolling portion 110A, and the rolling portion 110A is wound on the rolling shaft 30. When the display panel 100 is in the unrolled state, the second arc surface display portion 113 and the first arc surface display portion 112 are symmetrically arranged with respect to the horizontal centerline $W_1$ of the plane display portion 111 in the direction perpendicular to the display panel 100, so that the display panel 100 can be kept as a whole when the display panel 100 is in the unrolled state, which not only can realize a high screen-to-body ratio of an overall screen, but also can improve aesthetics of the display panel 100.

Furthermore, the first supporting sub portion 210 includes a supporting rolling portion 210A arranged corresponding to the rolling portion 110A. An orthographic projection of the supporting rolling portion 210A on the display panel 100 overlaps the rolling portion 110A; and a shape of the supporting rolling portion 210A is matched with a shape of the rolling portion 110A, so that the display panel 100 is evenly unrolled, which prevents local warpage of the display panel 100 and makes the display panel 100 more stable in use. Wherein the supporting rolling portion 210A is wound on the rolling shaft 30 and includes a plurality of hollowing portions (not shown in figure).

Specifically, the hollowing portions include a plurality of hollowing holes. This embodiment does not make specific restrictions on shapes of the hollowing holes. Preferably, in this embodiment, the hollowing holes penetrate the supporting rolling portion 210A; and the hollowing hole is a central symmetrical structure, so as to reduce bending stiffness of the supporting rolling portion 210A and improve flexibility of the rolling portion 110A of the display module 10, so that it can well adapt to and bear rolling or unrolling driven by the rolling shaft 30. Furthermore, a risk of debonding and fracture of the film layers of the display module 10 is reduced, and an overall yield and reliability of the display module 10 are improved.

Furthermore, in this embodiment, the bottom frame 21 includes a first bottom frame 21A and a second bottom frame 21B slidably connected to each other. An orthographic projection of the first bottom frame 21A in the direction perpendicular to the display module 10 at least partially overlaps with an orthographic projection of the second bottom frame 21B in the direction perpendicular to the display module 10. The first frame 22 is located on one side of the first bottom frame 21A close to the first arc surface display portion 112. The front frame 20 further includes a second frame 23 located on one side of the second bottom frame 21B close to the rolling shaft 30, and the second frame 23 is perpendicular to the second frame 21B. Wherein in the direction perpendicular to the display panel 100, a height of a horizontal plane where a top surface of the second frame 23 is located is less than or equal to the height of the horizontal plane where the top surface of the encapsulation structure 700 is located. It should be noted that in this embodiment, there are no specific restrictions on a sliding link mode of the first bottom frame 21A and the second bottom frame 21B.

It can be understood that in this embodiment, by setting a sliding link between the first bottom frame 21A and the second bottom frame 21B, the orthographic projection of the first bottom frame 21A in the direction perpendicular to the display module 10 at least partially overlaps the orthographic projection of the second bottom frame 21B in the direction perpendicular to the display module 10, so as to prevent influence of the front frame 20 on the rolling or unrolling of the display panel 100. Moreover, in the direction perpendicular to the display panel 100, the height of the horizontal plane where the top surface of the first frame 22 is located is less than or equal to the height of the horizontal plane where the top surface of the encapsulation structure 700 is located, and the height of the horizontal plane where the top surface of the second frame 23 is located is less than or equal to the height of the horizontal plane where the top surface of the encapsulation structure 700 is located, so as to eliminate the occurrence of adverse phenomena such as the motion interference caused by the touch between fingers and the edge of the front frame 20 when swiping the screen in the prior art. Preferably, in this embodiment, a distance between the height of the horizontal plane where the top surface of the first frame 22 is located and the height of the horizontal plane where the top surface of the encapsulation structure 700 is located is $H_1$, and a distance between the height of the horizontal plane where the top surface of the second frame 23 is located and the height of the horizontal plane where the top surface of the encapsulation structure 700 is located is $H_2$.

Furthermore, in this embodiment, the display device 1 further includes a binding component 800 connected to the binding portion 130 and a supporting member 500 located between the binding portion 130 and the first supporting sub portion 210. Wherein in a direction from the second frame 23 pointing to the first frame 22, a thickness of the supporting member 500 gradually increases, so as to increase a distance between the binding component 800 and the first bottom frame 21A, which can prevent the binding component 800 from directly contacting the bottom frame 21, so as to reduce wear of the binding component 800 and improve service life of the display module 10.

A mobile terminal is provided in the embodiment of the present application. The mobile terminal includes a terminal body and the display device described in any one of the above-mentioned embodiments, and the terminal body is combined with the display device as a whole.

It can be understood that the display module has been described in detail in the above-mentioned embodiments, and the description is not repeated here.

In specific applications, the mobile terminal can be a display screen of a device such as smart phones, tablets, laptops, smart bracelets, smart watches, smart glasses, smart helmets, desktop computers, smart TVs, or digital cameras, and even can be applied to electronic devices with flexible display screens.

The display device and the mobile terminal are provided in the present application. The display device includes the display module, and the display module includes the display panel and the supporting layer located at the backlight side of the display panel. The display panel includes the display portion and the binding portion arranged opposite to each other, and the bending portion connected between the display portion and the binding portion. By setting the display portion to include the plane display portion and the first arc surface display portion connected between the plane display portion and the bending portion, the height of the front frame in the existing display device is reduced, so that the orthographic projection of the display portion in the direction perpendicular to the display module covers the bending portion. In the direction of the light-emitting side of the display module, the height of the horizontal plane where the top surface of the display portion is located is greater than or equal to the height of the horizontal plane where the top surface of the front frame is located, so as to eliminate the occurrence of adverse phenomena such as the motion interference caused by the touch between fingers and the edge of the front frame when swiping the screen in the prior art. Moreover, by setting the supporting layer to include the first supporting sub portion corresponding to the plane display portion and the second supporting sub portion corresponding to the first arc surface display portion, the orthographic projection of the first supporting sub portion on the display panel overlaps the plane display portion, and the orthographic projection of the second supporting sub portion on the display panel overlaps the first arc surface display portion. The shape of the second supporting sub portion is matched with the shape of the first arc surface display portion, so as to support the display panel.

In summary, although the present application has been disclosed as above with preferred embodiments, the above-mentioned preferred embodiments are not intended to limit the invention. Ordinary technicians in the art can make various changes and refinements without departing from the spirit and scope of the invention. Therefore, the scope of protection of the present application is subject to the scope defined in the claims.

What is claimed is:

1. A display device, comprising a front frame and a display module located in the front frame, and the display module comprising:
   a display panel comprising a display portion and a binding portion arranged opposite to each other, and a bending portion connected between the display portion and the binding portion; and the display portion comprising a plane display portion and a first arc surface display portion connected between the plane display portion and the bending portion;
   an encapsulation structure arranged on a light-emitting side of the display panel; and
   a supporting layer located on one side of the display portion close to the binding portion, and the supporting layer comprising a first supporting sub portion arranged corresponding to the plane display portion and a second supporting sub portion arranged corresponding to the first arc surface display portion; and a shape of the second supporting sub portion being matched with a shape of the first arc surface display portion;
   wherein in a direction of the light-emitting side of the display module, a height of a horizontal plane where a top surface of the encapsulation structure is located is greater than or equal to a height of a horizontal plane where a top surface of the front frame is located.

2. The display device as claimed in claim 1, wherein the front frame comprises a bottom frame located on one side of the supporting layer away from the display panel and a first frame located on one side of the bottom frame close to the first arc surface display portion, and the first frame is perpendicular to the bottom frame; and in a direction perpendicular to the display panel, a height of a horizontal plane where a top surface of the first frame is located is less than or equal to the height of the horizontal plane where the top surface of the encapsulation structure is located.

3. The display device as claimed in claim 2, wherein the display portion comprises a second arc surface display portion extending along a direction of the plane display portion away from the first arc surface display portion;
   the supporting layer comprises a third supporting sub portion extending along a direction of the first supporting sub portion away from the second supporting sub portion; the third supporting sub portion is arranged opposite to the second arc surface display portion, and a shape of the third supporting sub portion is matched with a shape of the second arc surface display portion; the front frame further comprises a second frame located on one side of the bottom frame close to the second arc surface display portion, and the second frame is perpendicular to the bottom frame; and wherein in the direction perpendicular to the display panel, a height of a horizontal surface where a top surface of the second frame is located is less than or equal to the height of the horizontal plane where the top surface of the encapsulation structure is located.

4. The display device as claimed in claim 3, wherein a radius of curvature of the first arc surface display portion is same as a radius of curvature of the second arc surface display portion.

5. The display device as claimed in claim 3, wherein the display device further comprises a binding component connected to the binding portion, and in a direction from the second frame pointing to the first frame, a distance between the binding portion and the bottom frame gradually decreases.

6. The display device as claimed in claim 5, wherein the display device comprises a supporting member, and the supporting member is located between the binding portion and the first supporting sub portion; and wherein in the direction from the second frame pointing to the first frame, a thickness of the supporting member gradually increases.

7. The display device as claimed in claim 3, wherein the display module comprises at least two non-bending areas and a bendable area arranged between adjacent two of the non-bending areas; at least a part of the plane display portion is located in the bendable area, and both the first arc surface display portion and the second arc surface display portion are located in the non-bending areas; and wherein the first supporting sub portion comprises a grid structure located in the bendable area.

8. The display device as claimed in claim 7, wherein a material of the supporting layer is metal.

9. The display device as claimed in claim 2, wherein the display portion comprises a rolling portion and a non-rolling portion connected between the rolling portion and the bending portion;

the display device comprises a rolling shaft located on the one side of the supporting layer away from the display panel and arranged close to the rolling portion; and the rolling portion is wound on the rolling shaft, and the rolling shaft is used to roll up or unroll the display module; and wherein the non-rolling portion comprises the first arc surface display portion, and the rolling portion comprises a second arc surface display portion along a direction of the plane display portion away from the first arc surface display portion; when the display panel is in a unrolled state, in the direction perpendicular to the display panel, the second arc surface display portion and the first arc surface display portion are symmetrically arranged with respect to a horizontal centerline of the plane display portion.

10. The display device as claimed in claim 9, wherein the first supporting sub portion comprises a supporting rolling portion arranged corresponding to the rolling portion, and a shape of the supporting rolling portion is matched with a shape of the rolling portion; wherein the supporting rolling portion is wound on the rolling shaft, and the supporting rolling portion comprises a plurality of hollowing portions; and wherein the front frame further comprises a second frame located on one side of the bottom frame close to the rolling portion, and the second frame is perpendicular to the bottom frame; and in the direction perpendicular to the display panel, a height of a horizontal plane where a top surface of the second frame is located is less than or equal to the height of the horizontal plane where the top surface of the encapsulation structure is located.

11. The display device as claimed in claim 10, wherein the display device further comprises a binding component connected to the binding portion and a supporting member located between the binding portion and the first supporting sub portion; and wherein in a direction from the second frame pointing to the first frame, a thickness of the supporting member gradually increases.

12. The display device as claimed in claim 1, wherein the encapsulation structure comprises a flexible substrate and a flexible cover plate arranged in layers, and the flexible substrate is located between the display panel and the flexible cover plate; and wherein a material of the flexible substrate is one of cover window and ultra-thin glass; and the flexible cover plate is a combination of a cover plate material protective window and an optically clear adhesive, and a material of the cover plate material protective window is one of polyethylene glycol terephthalate and colorless polyimide.

13. A mobile terminal, comprising a terminal body and a display device, the terminal body and the display device being integrated, and the display device comprising a front frame and a display module located in the front frame, and the display module comprising:

a display panel, the display panel comprising a display portion and a binding portion arranged opposite to each other, and a bending portion connected between the display portion and the binding portion; and the display portion comprising a plane display portion and a first arc surface display portion connected between the plane display portion and the bending portion;

an encapsulation structure arranged on a light-emitting side of the display panel; and a supporting layer located on one side of the display portion close to the binding portion, and the supporting layer comprising a first supporting sub portion arranged corresponding to the plane display portion and a second supporting sub portion arranged corresponding to the first arc surface display portion; and a shape of the second supporting sub portion being matched with a shape of the first arc surface display portion;

wherein in a direction of the light-emitting side of the display module, a height of a horizontal plane where a top surface of the encapsulation structure is located is greater than or equal to a height of a horizontal plane where a top surface of the front frame is located.

14. The mobile terminal as claimed in claim 13, wherein the front frame comprises a bottom frame located on one side of the supporting layer away from the display panel and a first frame located on one side of the bottom frame close to the first arc surface display portion, and the first frame is perpendicular to the bottom frame; and in a direction perpendicular to the display panel, a height of a horizontal plane where a top surface of the first frame is located is less than or equal to the height of the horizontal plane where the top surface of the encapsulation structure is located.

15. The mobile terminal as claimed in claim 14, wherein the display portion comprises a second arc surface display portion extending along a direction of the plane display portion away from the first arc surface display portion;
the supporting layer comprises a third supporting sub portion extending along a direction of the first supporting sub portion away from the second supporting sub portion; the third supporting sub portion is arranged opposite to the second arc surface display portion, and a shape of the third supporting sub portion is matched with a shape of the second arc surface display portion;
the front frame further comprises a second frame located on one side of the bottom frame close to the second arc surface display portion, and the second frame is perpendicular to the bottom frame; and
wherein in the direction perpendicular to the display panel, a height of a horizontal surface where a top surface of the second frame is located is less than or equal to the height of the horizontal plane where the top surface of the encapsulation structure is located.

16. The mobile terminal as claimed in claim 15, wherein a radius of curvature of the first arc surface display portion is same as a radius of curvature of the second arc surface display portion.

17. The mobile terminal as claimed in claim 15, wherein the display device further comprises a binding component connected to the binding portion, and in a direction from the second frame pointing to the first frame, a distance between the binding portion and the bottom frame gradually decreases.

18. The mobile terminal as claimed in claim 17, wherein the display device comprises a supporting member, and the supporting member is located between the binding portion and the first supporting sub portion; and wherein in the direction from the second frame pointing to the first frame, a thickness of the supporting member gradually increases.

19. The mobile terminal as claimed in claim 15, wherein the display module comprises at least two non-bending areas and a bendable area arranged between adjacent two of the non-bending areas; at least a part of the plane display portion is located in the bendable area, and both the first arc surface display portion and the second arc surface display portion are located in the non-bending areas; and
wherein the first supporting sub portion comprises a grid structure located in the bendable area.

20. The mobile terminal as claimed in claim 19, wherein a material of the supporting layer is metal.

* * * * *